US012137520B1

(12) United States Patent
Cromarty et al.

(10) Patent No.: US 12,137,520 B1
(45) Date of Patent: Nov. 5, 2024

(54) EDUCATIONAL ELECTRONICS SYSTEMS AND METHODS

(71) Applicant: HEATHKIT COMPANY, INC., Ottsville, PA (US)

(72) Inventors: Andrew S. Cromarty, Palo Alto, CA (US); Donald J. Peterson, Santa Cruz, CA (US); Jasen Levoy, Santa Cruz, CA (US); William Charles Calhoun, Richland, WA (US); David Brainerd, Santa Cruz, CA (US); Ann E. Cromarty, Ottsville, PA (US); Simon A. Cromarty, Santa Cruz, CA (US)

(73) Assignee: HEATHKIT COMPANY, INC., Ottsville, PA (US)

( * ) Notice: Subject to any disclaimer, the term of this patent is extended or adjusted under 35 U.S.C. 154(b) by 0 days.

(21) Appl. No.: 18/506,841

(22) Filed: Nov. 10, 2023

Related U.S. Application Data

(62) Division of application No. 16/393,953, filed on Apr. 24, 2019, now Pat. No. 11,864,311.

(60) Provisional application No. 62/662,644, filed on Apr. 25, 2018.

(51) Int. Cl.
| | |
|---|---|
| *F24C 7/08* | (2006.01) |
| *F24C 7/04* | (2021.01) |
| *G01R 31/28* | (2006.01) |
| *G09B 23/18* | (2006.01) |
| *H05K 1/02* | (2006.01) |
| *H05K 5/02* | (2006.01) |
| *H05K 7/14* | (2006.01) |

(52) U.S. Cl.
CPC .......... *H05K 1/0295* (2013.01); *F24C 7/046* (2013.01); *F24C 7/085* (2013.01); *G01R 31/28* (2013.01); *G09B 23/185* (2013.01); *H05K 1/0266* (2013.01); *H05K 5/0217* (2013.01); *H05K 7/1402* (2013.01)

(58) Field of Classification Search
CPC .... H05K 1/0295; H05K 1/0266; F24C 7/046; F24C 7/085; G01R 31/28; G09B 23/185
See application file for complete search history.

(56) References Cited

U.S. PATENT DOCUMENTS

2018/0226056 A1  8/2018  Chan

FOREIGN PATENT DOCUMENTS

EP        0203772 A1   12/1986

*Primary Examiner* — Jeremy C Norris
(74) *Attorney, Agent, or Firm* — SQUIRE PATTON BOGGS (US) LLP

(57) ABSTRACT

Systems and methods for educational electronics devices such as may be assembled by non-manufacturer builders, including by personal or hobbyist individuals and by groups such as clubs or classes. Methods and systems relate to Surface Mount Device (SMD) use, measurement systems, communications skill acquisition, physical construction of educational electronics, builder construction/configuration and maintenance of devices, subsystem componentry designed for effective use in educational electronics, circuit designs that permit individual builders to construct professional quality devices, and cognitively adapted methods and systems to optimize learning and performance during and after builder assembly.

20 Claims, 11 Drawing Sheets

EDUCATIONAL ELECTRONICS SYSTEMS AND METHODS

CROSS-REFERENCE TO RELATED APPLICATIONS

The present application is a divisional of U.S. patent application Ser. No. 16/393,953, filed on Apr. 24, 2019, which claims the benefit of U.S. Provisional Application No. 62/662,644, filed Apr. 25, 2018. The contents of the above-referenced applications are hereby incorporated by reference in their entireties.

The present application is related to U.S. Provisional Application No. 62/364,649, filed Jul. 20, 2016; U.S. Provisional Application No. 62/364,900, filed Jul. 21, 2016; U.S. patent application Ser. No. 15/221,279, filed Jul. 27, 2016, incorporated herein by reference: U.S. patent application Ser. No. 15/282,314, filed Jul. 27, 2016, now U.S. Pat. No. 10,219,398, issued Feb. 26, 2019; U.S. application Ser. No. 16/284,892, filed Feb. 25, 2019, as a continuation of U.S. patent application Ser. No. 15/282,314; and U.S. Provisional Application No. 62/507,273, filed May 17, 2017. All of the just-referenced provisional and non-provisional applications are incorporated herein by reference.

FIELD OF THE INVENTION

The present invention generally relates to systems and methods for education in electronics equipment, and more particularly, to systems and methods that are pedagogically effective in learning electronics through individual or group construction, maintenance, and use of high-performance modern electronic equipment. Novel methods and systems also are disclosed for individuals or groups to produce and measure uncommonly higher quality and higher performance electronics meeting or exceeding the quality, performance standards and capabilities of modern manufactured electronics, including for communications use.

BACKGROUND

Historically throughout the twentieth century, electronics devices were created using physically large electronic and electromechanical components that are quite easily accessed and handled by individual, home and student builders, notably including "through hole" parts. In modern electronics, most such components have been obsoleted, and instead Surface Mount Devices (SMD) are employed, and required. As one example, a modern commercially-manufactured mobile or cell phone or personal digital assistant (PDA) device generally would be impossible for an individual electronics hobbyist to build in a conventional modern handheld form factor using historic large through hole parts.

It would be highly beneficial to provide for competent use of SMD components in personal (vs. manufacturer) electronics construction, as by individuals or by group builders such as in a club or classroom setting. Market factors including parts availability and variety, sales volume driven by use in modern electronics, and quantity parts pricing have made SMD parts considerably more attractive than older through hole parts on average, and in many cases effectively eliminated larger parts from the market. In addition, successful use of small modern SMD parts combined with careful thoughtful design methods and systems would allow builders to construct small compact appliance devices that are in principle competitive with commercially-manufactured equipment.

SMD use is, however, challenging. No well-defined established accepted pedagogy complete with a set of competently designed commercially-supported properly-documented SMD electronics methods and systems has been available to aspiring builders. SMD components entail unique technical characteristics including different construction and assembly technique requirements, parts management challenges for near-microscopic components, unfamiliarity with new parts types by personal builders, and difficulty in parts identification for tiny parts too small to bear a helpful readable marking visible to the naked eye.

With careful selection and proper circuit design. SMD parts can provide for additional new features in electronics devices, but configuring and managing many newer SMD parts often requires special skills, and still more specialized SMD parts, such as microcontroller (MCU) or microprocessor (MPU) control using specially designed printed circuit boards (PCBs) with appropriate traces allocated to provide control signaling and data via SPI or I2C control. The datasheet for such a modern MCU easily can exceed one thousand pages, and understanding such a device well enough to control a single adjacent SMD device in a circuit becomes a daunting prospect for a hobbyist or student.

In the past decade, small microcontrollers such as the "Arduino™" and "Raspberry Pi™" single-board computers (SBCs) have become popular among hobbyists. These SBCs provide the pleasant fiction of low-level electronics engagement and control by the builder. In practice, however, these generic one-size-fits-all "canned" composite SBC devices move builders farther and farther away from the opportunity to build their own commercial appliance-quality electronics, because they fail to provide a competent set of well-designed building blocks capable of leading to construction of devices of lasting value. They also generally entail no direct use of or experience with the underlying physical SMD devices that form the basis for modern electronics. Instead their use draws aspiring electronics builders away from building physical electronics, initially by diluting their efforts with software development in toy language environments that control simplistic short-lived hobbyist projects, and eventually away from electronics altogether. Meanwhile, increasingly. Surface Mount Technology (SMT) and use of the corresponding SMD parts remains widely viewed as intimidating by personal electronics builders.

In fact introducing personal builders to SMT provides additional learning and building opportunities. New form factors are possible with use of tiny parts. Objects made from printed circuit boards (PCBs) with through hole parts generally cannot lie flat, but PCBs comprising only surface-mounted parts can lie perfectly flat and designs can be fitted to new physical presentation or delivery formats for the resulting device. SMD-based PCB form factors opportunities include designs that would expose PCB material comprising partial or quite complete circuits combined with components providing additional value on the PCB. Relevant pedagogical information printed directly on the PCB now becomes possible as part of a training and information delivery method and system. Additional device features are possible, such as providing alternative measurement and additional content integrated into the device. It becomes possible to provide not only the entire electronic circuit, but also pedagogical information about it such as its schematic diagram, parts identification data, performance data, multiple alternative informational labels for the circuit or its components, data for its use, opportunities for safe effective owner-builder modification and upgrade, and not inconsequentially, direct viewing of the finished device or appliance to permit the builder's work to be a source of well-earned pride of accomplishment.

Educational electronics systems also can benefit from newly designed systems and methods for construction including as to physical enclosures. For example, an educational electronics system with user-modifiable knockouts and penetrations will permit user-mountable parts to be incorporated both at initial assembly time and also as later feature upgrades the builders may themselves perform.

Use of SMD components also provides novel opportunities for an educational electronic system to comprise built-in pedagogical and self-test functions, including those expressly intended to support the needs of a new or uncertain builder such as a student. For example, higher component density and greater capability per component achievable with SMDs makes possible addition to the circuit of a microprocessor (MPU) or microcontroller (MCU) that can be programmed in whole or in part to provide such novel assistive functions to the builder during and after construction. The circuit now can accommodate and comprise additional components that measure and report on the builder's success while circuit construction still is in progress, and confirm success, assist in diagnosis, and support reconfiguration, adaptation or upgrade once the initial electronics construction effort is complete.

Certain novel circuits would enhance the performance and pedagogical value of the disclosed systems, including through use of newly available SMD components. Cryptographic methods such as cryptographically competent enumeration and digital fingerprinting could be applied to provide for unique product identification, intellectual property control, individual configuration and management of constructed devices, personal security, and personal archival and distributed or cooperative use of configuration and model data. Other novel circuits could improve performance of personally-constructed communications and electronic equipment, with the beneficial effect of permitting builders to construct very high performance systems, including through use of reusable-subsystem components that support dynamic device-specific configuration and management, using component subsystems designed expressly to permit human users rather than machines to assemble a commercial-quality electronic appliance using SMD parts that typically are intractably small and otherwise would be effectively impossible for home builders or students to employ in a circuit. Additional non-electronic physical features of the device can provide further pedagogical and practical benefits, such as by embedding alternative mathematical transforms and models directly into the device in either electronic and digital form or physical and display form such as to support direct measurement of quantities that normally must be computed or inferred.

Educational electronic systems also may comprise systems for teaching basic and advanced communications skills. For example, Morse code is a century-old communications skill still in contemporary use that entails significant learning cost and individual effort. The cognitive burden of learning Morse communications to the degree required for effective communications is significant, and common Morse teaching techniques can increase rather than alleviate this burden. Novel methods and systems for teaching Morse code would combine one or more of SMD electronics, novel consumer-buildable circuits, and pedagogical information and methods that are selected, presented and configured to optimize learning and performance and minimize cognitive burden. Similar pedagogical system and method opportunities exist for construction in other electronics-related domains, such as construction of test equipment. Such educational methods and systems may further be designed to provide ancillary benefits, including by being integrated with or rewarding desirable or beneficial behaviors and habits, such as personal health and exercise regimes.

SUMMARY OF THE INVENTION

In one aspect, the invention provides a learning device, comprising: a stereo headset, configured for safety to permitting hearing ambient sound; and a microphone for vocal input: wherein, a user of the device listens to information content audibly presented in the headset while engaged in a physical activity such as walking; and the portable device measures both the vocal response of the user to information content and physical activity of the user while the system is in use; and the device computes a reward metric and provides a reward signal to the user corresponding to the user's vocal responses and physical activity.

In one aspect, the invention provides a learning method, comprising: listening to a stereo headset component of a portable device, and vocalizing into a microphone responsive to information content audibly presented in the headset while engaged in a physical activity such as walking: wherein the portable device measures both the vocal response of the user to information content and physical activity of the user while the system is in use; and the device computes a reward metric and provides a reward signal to the user corresponding to the user's vocal responses and physical activity.

In one aspect, the invention provides a system for teaching electronics, comprising: a printed circuit board configured to accept surface mount device electronics components, further adapted to provide information content in its silkscreen comprising at least one of a schematic diagram, reference data, pictorial information, and ruler scale markings: wherein the solder pad footprints for the surface mount device have been adapted to accept more than one size of surface mount device compatibly.

In one aspect, the invention provides a measurement system, comprising: a measurement device comprising one of a ruler or tape measure device having ruler scale length markings: wherein at least one ruler marking scale is adapted to provide a mathematical transform of length measurement. The transform may comprise scaling by a factor of pi, providing direct measurement of diameter. Alternatively, the transform may comprise scaling by a factor of pi/2, providing direct measurement of radius.

In one aspect, the invention provides a system for assisting electronics assembly, comprising: an electronic device being assembled by a builder: an assistive component comprising a microcontroller/microprocessor having embedded or attached memory: circuit connections from the microcontroller or microprocessor to one or a plurality of test points in the circuit: model data characterizing the operation of the device under assembly with respect to defined test values in correspondence with one or a plurality of assembly steps, wherein said model data are stored in the microcontroller/microprocessor or its attached memory; and firmware in the microcontroller/microprocessor adapted to take at least one measurement from the one or a plurality of test points and compare it to the model data in order to confirm or disconfirm proper operation corresponding to a completed assembly step.

In one aspect, the invention provides a VU meter device, comprising: A display of signal level in standard units: at least one digital or analog signal input: a microcontroller/ microprocessor comprising memory and firmware for at least one of measuring, recording, displaying, and reporting information about at least one input signal level, wherein the microcontroller/microprocessor records in memory at least one of a minimum and maximum input signal level: a data value comprising an alarm threshold level; and an alarm function in the firmware that displays or transmits a corresponding signal or data when the input signal level exceeds the alarm threshold value. In accordance with this aspect, the microcontroller/microprocessor may record in memory both a minimum and maximum level, and a range of the display being activated in correspondence with the minimum to maximum stored values, comprising display of the input signal level dynamic range.

In one aspect, the invention provides a Local Oscillator (LO) subsystem device, comprising: a synthesizer component configurable to produce at least one oscillator output responsive to data received from a microcontroller/microprocessor: a microcontroller/microprocessor attached to the synthesizer component on the same printed circuit board (PCB) by PCB traces: firmware in the microcontroller/ microprocessor adapted to send commands and data to the synthesizer to specify at least one frequency to be issued by the synthesizer; wherein the microcontroller/microprocessor and synthesizer are surface mounted parts mounted on a single daughterboard comprising an electrically transmissive connector or header that affords mounting the daughterboard to another PCB or electronic apparatus.

In one aspect, the invention provides a temperature control oven comprising at least one resistive heating component, at least one diode-junction sensing component, a constructible enclosure component comprised of material that is not heat transmissive, and a microcontroller/microprocessor having memory containing at least one temperature threshold value: wherein the microcontroller/microprocessor is connected to the sensing and heating components and is adapted operably to sense the temperature through current measurement of the sensing component, and to heat the oven by sending current to the heating component until the threshold temperature value is achieved at the sensing component: wherein all components including the enclosure are constructible by an individual electronics builder.

In one aspect, the invention provides a Local Oscillator (LO) subsystem device in combination with the temperature control oven as just described.

In one aspect, the invention provides an electronic system comprising: a Doubly Balanced Mixer (DBM) circuit: a Local Oscillator (LO) port to the DBM adapted to accept a balanced input: a nonreactive impedance matching network the output of which is operably connected to the balanced input port; and a LO circuit operably attached to the input of said impedance matching network by an AC coupling and impedance matching circuit: wherein the selection of pullup, pulldown, or voltage divider devices at the output of the LO are optimized to minimize thermal noise.

DETAILED DESCRIPTION OF EMBODIMENTS

Figure 1:
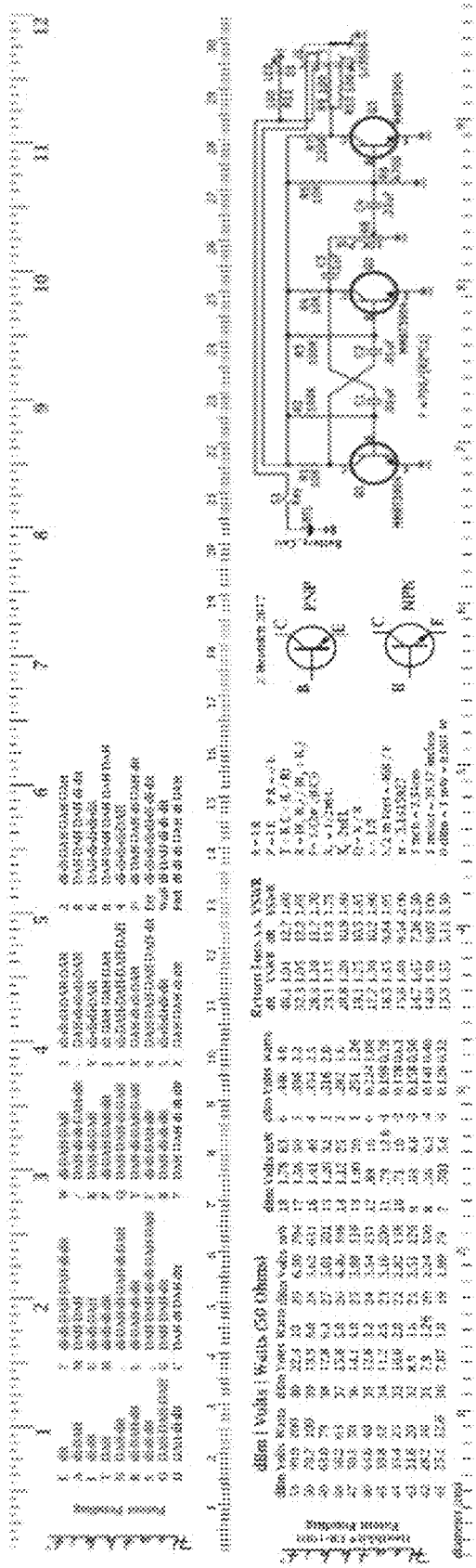
FIG. 1 depicts an exemplary embodiment of an Active Ruler™ showing educational information content including reference material, communications technique pedagogical data, schematic diagram, component identification, standard and scaled-function ruler markings, and a region where a builder will attach SMD components.
Figure 2A:
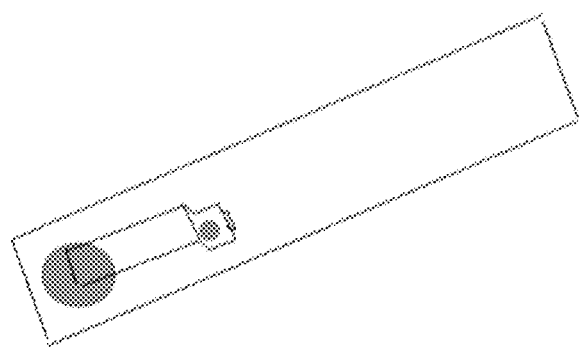
FIG. 2A depicts an exemplary SMD Morse code key depicted over a coin cell battery as its electrical contact ready for keying, with a tail tab descending into the PCB.
Figure 2B:
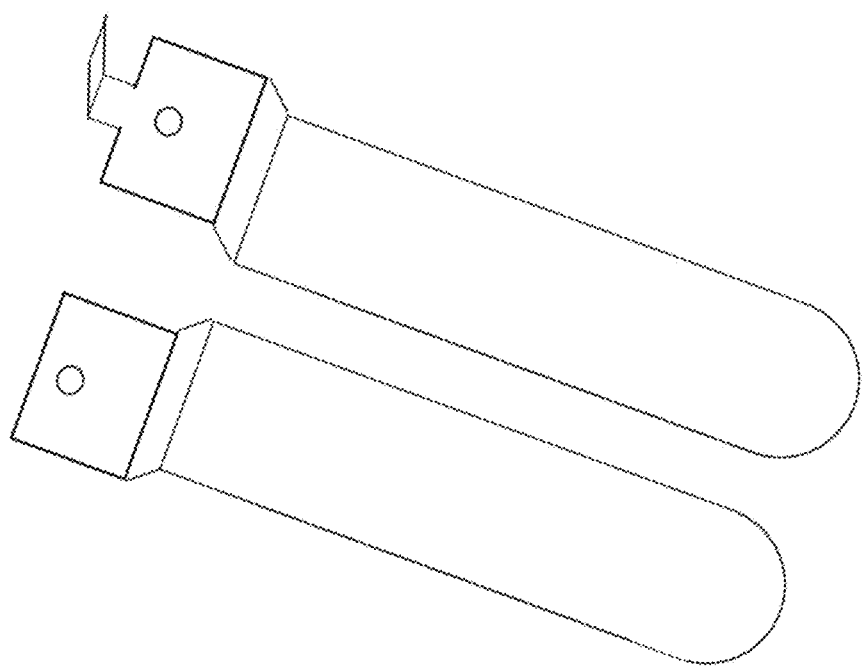
FIG. 2B depicts a physical code key samples clearly showing tab tail used for structurally sound and stable assembly by builder.
Figure 2C:
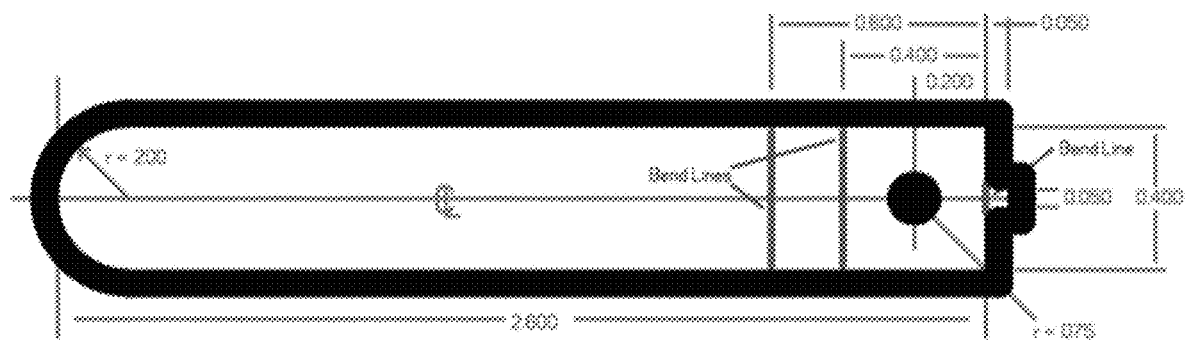
FIG. 2C depicts surface mount code key materials before shaping into a 3D code key, marked to indicate bends and tail tab, depicting the disclosed method of fabrication.
Figure 3A:
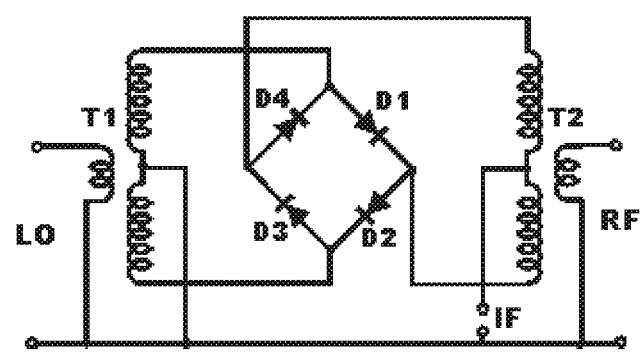
FIGS. 3A and 3B depict a conventional DBM circuit with single-sided (unbalanced) feed, in two common schematic depictions, respectively.
Figure 3B:
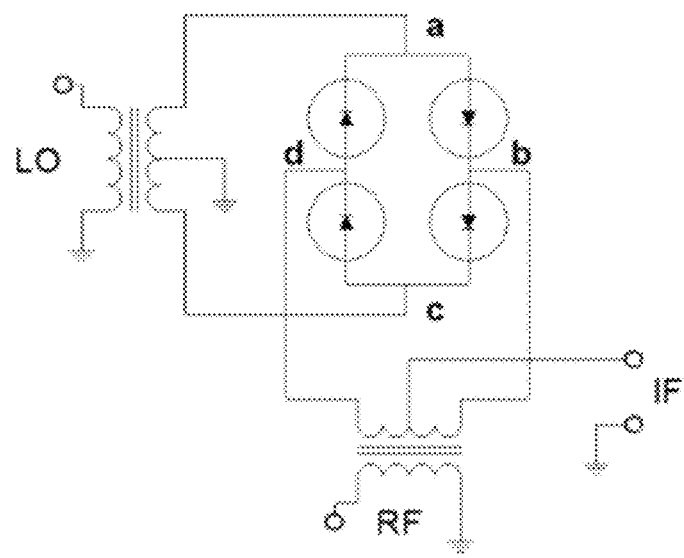
Figure 4:
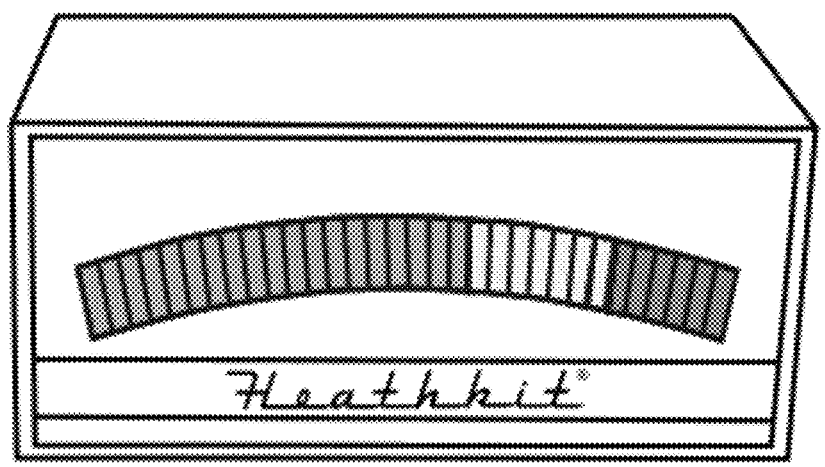
FIG. 4 depicts an exemplary VU meter with arc-shaped display comprising rectangular LEDs, in which the depicted gray scale corresponds to multiple colors.
Figure 5:
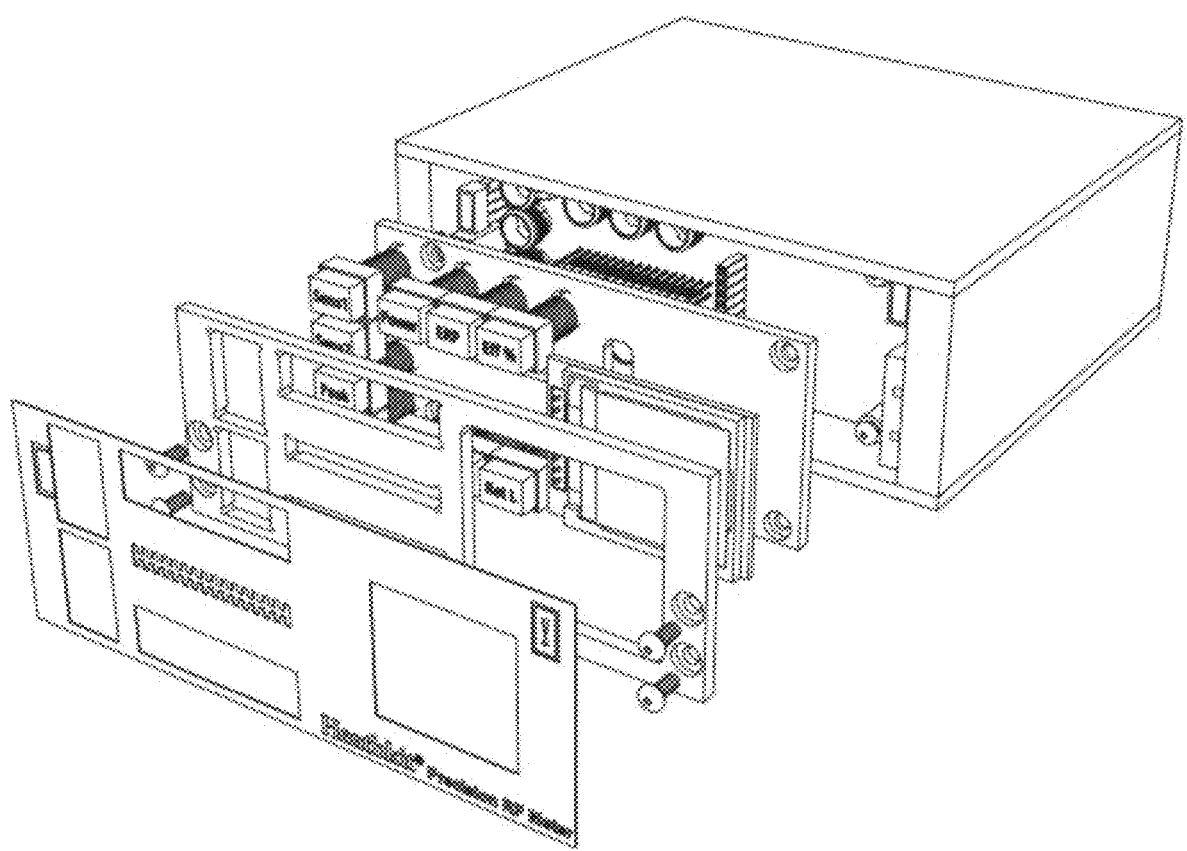
FIG. 5 depicts an exemplary embodiment of an electronic device for builder assembly as an exploded diagram, showing multiple subpanels in precise registration with differing but aligned penetrations, a stabilizing mounting system, and a graphic overlay.

Systems and methods for use in cognitive-based learning, such as for Morse code:

We disclose systems and methods for pedagogy, self-training, and self-improvement in electronics-related communications skills, such as in an exemplary task of learning or improving Morse code sending and receiving capability.

In one embodiment, the user executes Morse code training steps using a portable device. Intended embodiments of the portable device include smart watches, fitness electronics, PDAs, smartphones, and wearable computing equipment. Wearable devices can comprise memory/storage of data input/output, computing electronics, and communications electronics including radio transceiver and antennas.

In one embodiment, the method and system comprises learning while exercising. In a preferred embodiment, the exercise comprises learning while walking. In a preferred embodiment, the device is portable. In an alternative embodiment, the device is nonportable and fixed, such as a desktop computer or a room-filling acoustic system, which also may be adapted to listen to the user's speech as well as to present sounds to the user. The device provides the ability for the user to listen to, or listen-and-repeat. Morse code. In a preferred embodiment, the portable device is easily carried while walking and comprises a stereo headset, preferably permitting some ability to hear ambient sounds for safety purposes, and a microphone input. In a preferred embodiment, the user listens to the Morse code while engaged in a physical activity such as walking, and the portable device measures physical activity of the user while the system is in use. In a preferred embodiment the system computes a reward metric and comprises a reward signal provided to the user. For example, the user may be provided encouragement audibly or via telecommunications, and records of the user's exercise activity is maintained correlated with the user's learning activity. This method and system beneficially keeps the user alert for improved learning, teaches the user to acquire and use Morse code in a psychologically relaxed state with less than full concentration required, provides for incentivized improved physical health, provides for enhanced cognitive association of Morse performance with alert cognitive states, and teaches the user that Morse code can be easy and casual in use in the same manner as human language speech rather than a taxing cognitive chore.

In one embodiment, sound is delivered to the user through stereo headphones providing different content to each ear. In one embodiment, one ear hears the pitch sounds of Morse code, and the other ear hears the spoken language equivalent of the Morse signal. The timing of delivery of the pitch tones and spoken words is adaptable and may be shifted or computed for optimal cognitive benefit. For example, the presentation of a spoken word may be timed for delivery just at, just before, or just after the experimentally determined time for cognitive association by a standard user at a given Morse code reception skill level, thus either simulating or prompting recognition by the user at the cognitively optimal time. In a preferred embodiment, the left and right content comprise mixed audio, wherein a continuously variable ratio of tone-only and speech-only sources are presented by the device ranging from 100% tone/0% speech to 100% speech/0% tone in the opposing ears according to a cognitive effectiveness model. In one embodiment, the ear chosen for delivery of differential speech vs. tone input is selected based on cognitive models of differential left and right brain function as to cognitive factors such as music vs. speech. In one embodiment, aspects of the presentation of speech and tone are modulated according to the sensed physical activity, length of learning activity session, demonstrated progress towards competency, and total invested learning time of the user. For example, speech/tone ratio for each ear. Morse code speed, intercharacter or interword spacing, time shift between speech and tone presentation, and/or time shift between speech or tone presentation and user's vocal or other responses may be modulated. In a preferred embodiment, the user must acknowledge a licensing agreement or requirement for external action in order to activate or use the system. For example, the device may require the user to acknowledge the importance or necessity of obtaining approval of a doctor before engaging in strenuous exercise. Similarly the user may be required to agree to use the device, methods and systems only in a safe manner, such as to ensure the user has determined in their sole judgment that there is no risk of accident or injury in using the device.

The device preferentially listens to the user vocally responding to and identifying the symbol or other Morse content the user hears. In a simple example embodiment, the user hears the Morse code tones for a letter, number or symbol and responds as quickly as possible with the name of that letter, number or symbol. In a preferred embodiment, the user hears and responds by identifying entire words and prosigns rather than mere letters. In a preferred embodiment, words and phrases are selected and presented during training for learning based on a value metric such as frequency of occurrence in actual relevant communications. In a preferred embodiment, the user is taught the true cognitive meaning rather than the literal translation of the sounds. For example, the tone sequence commonly denoted "didididit didit dididit didit" and sometimes printed "HIHI" represents laughter in Morse code, and preferentially the device teaches and then expects a response from the user such as the spoken word "laughter" rather than a vocalization like "HIHI." In a preferred embodiment, the method comprises using the system to teach cognitively meaningful speech patterns and components. For example, in this method common prefixes such as "pre." "re" and "in" and suffixes such as "ing" and "er" are taught in unitary fashion as a single sound to which the user must properly respond by vocalizing the unitary prefix or suffix, rather than as individual letters. This beneficially teaches the user to hear word fragments, words, and sentence fragments in Morse as humans routinely do in listening to spoken human language, reducing cognitive burden and more quickly leading to a much higher degree of performance proficiency.

In one embodiment, the device comprises a microphone that listens to user speak what the user hears, and uses electronics and/or computing hardware and software to compare the user's spoken responses against stored or generated-and-saved Morse content to assess the user's vocalizations for correctness & accuracy. In another embodiment, the user's responses are stored for later comparison, evaluation, display, reporting, reward computation and delivery, progress tracking, proficiency measurement, learning challenge diagnosis, publication to social media, sharing with teachers, sharing with friends and colleagues, and scheduling of future learning session content and configuration.

It will be appreciated that Morse code learning in this disclosure is exemplary, and that the disclosed methods and systems are effective for and intended to be applied to other learning content. For example, academic content, music content, public-speaking content memorization, new-language learning, vocabulary learning, cognitive behavioral therapy (CBT) self-affirmations, historical data learning, professional skill-based content learning, and theater or other artistic performance content learning all are within the intended scope of this disclosure. All may benefit from the disclosed methods and systems, including use of a feedback system, use of a cognitive learning model embodied in a portable system, integration of a tracking and reward model, integration with external beneficial activities such as exercise, time-shifting of multiple streams of cognitive content, performance tracking, performance diagnosis and tuning of content delivery in response to the user's specific personal learning experience, and use of highly compact electronic devices that now for the first time uniquely enable these methods and systems to be made available in an affordable device.

Systems and Methods for Cognitive-Based Learning Employing SMT, and Active Rulers™:

We disclose further systems and methods for pedagogy, self-training, and self-improvement in electronics skills, such as in learning to work with surface-mount electronics to construct commercial-quality electronic devices.

The physical characteristics of SMD components mounted on a surface provide a novel opportunity for new "lie-flat" form factors in finished electronic devices. We disclose an exemplary class of novel such devices, called "Active Rulers™." An essential feature of the Active Ruler is the attachment of SMD components to its upper surface. Attachment of SMD devices only to the upper surface allows the Active Ruler to lie flat on a surface. The electronics are functional rather than merely cosmetic, that is, they perform a useful function as an electronic circuit. Information content printed onto the Active Ruler assists the builder in constructing the ruler, and assists its subsequent user in using the Active Ruler for its intended functional purposes once completed. In a preferred embodiment, the information content is cost-effectively silkscreened onto the Active Ruler over the solder mask during the PCB manufacturing process.

An exemplary Active Ruler embodiment comprises Code Practice Oscillator (CPO) electronics suitable for learning, teaching, and using Morse code. An exemplary CPO Ruler embodiment provides one or more of the benefits of SMT skill teaching, a pedagogical device to assist in Morse code skill acquisition, a reference device comprising relevant educational and practical information content, and novel useful measurement capability.

The tiniest SMD components are quite difficult to master for most builders, and in commercial use are attached to circuits using robotic manufacturing means. In the exemplary Active Ruler, the circuit and PCB are therefore designed to accommodate larger more human-manageable sizes of SMD parts. In a preferred embodiment, the PCB pads and traces are carefully design and laid out to permit each individual builder to choose to use either nominal 10xx or 12xx-size (e.g. 1206) parts, or alternatively, 18xx or 20xx size (e.g. 2010) SMD parts, at a single PCB pad pair. In this embodiment, the larger (e.g. 2010) size pad "footprints" first are used for initial PCB part placement in a first circuit layout design step. The pad sizes are then "grown" in towards each other, that is, the exposed area not covered by solder mask is augmented at the point where the two pads for a component have their closest approach, until the interpad spacing is nominally equal to the interpad spacing that would be used for the smaller SMD parts. This method and system allows either a larger or smaller size part to be soldered into place by the builder. This beneficially permits builders with less manual dexterity or poorer vision to assemble an electronics kit using larger-size more easily-managed parts, and other builders to choose to learn using smaller, less expensive, more available parts, all using the same single PCB design. In a preferred embodiment, the augmented pad sizes that permit multiple different SMD parts to be applied to the PCB are precomputed to produce augmented "footprints." which are stored in a Computer-Aided Design (CAD) system's "footprint" library, to be applied at circuit design and PCB layout time. This beneficially speeds development, provides for standard pad layouts, reduces inefficiency and risk of design error during circuit design and PCB layout, permits efficient production and use of standard repeatable circuit subsystems and PCB layouts, and supports a scalable design method for user-built electronics systems employing SMD components. It will be appreciated that the SMD component sizes in this disclosure's embodiments are exemplary and all combinations of component types, sizes and shapes are within the intended scope of this disclosure.

In a preferred embodiment, the SMD-based circuit comprises an exposed PCB and SMD circuit parts upon completion of construction. Relevant pedagogical information is printed directly on the PCB and serves as a training and information delivery method and system.

Additional device features such as alternative measurement and additional content are possible. In one embodiment, the Active Ruler comprises conventional ruler markings along its body, such as to depict and provide for measurement of length in common units such as inches, millimeters and/or centimeters. In one embodiment, mathematical transforms are applied to standard measurement scales such as to permit direct measurement of scaled or nonlinear quantities without computation. In a preferred embodiment, the Active Ruler comprises an exemplary measurement scale that is scaled by the mathematical quantity pi, which may be further scaled by a scalar integer, fractional, or polynomial or nonlinear mathematical function, providing for direct measurement of circular quantities such as diameter, radius, and area. In an exemplary embodiment, a ruler scale along one side of the Active Ruler is marked in "centimeter diameter units" wherein the distance between the markings for (for example) zero and one is exactly pi centimeters (approximately 3.1415927 cm) in length. Then a length of material such as a string wrapped around a cylinder to determine its circumference can be laid against the ruler edge and the diameter of the cylinder may be directly read from the Active Ruler without computation. It will be appreciated that alternative mathematical transforms are possible and intended, and that a flexible measuring device such as a tape measure also may be marked with one or more mathematically scaled or transformed markings, alone or in addition to conventional linear one-to-one scale markings. Thus, for example, a "diameter tape measure" that directly reads the diameter of an object around which the tape is wrapped is now disclosed. Direct reading of radius measurements is similarly disclosed, by scaling by pi/2. For example, such a tape measure wrapped around a tree provides instant correct computation-free direct measurement of the tree's diameter or radius by directly reading the markings on the measuring tape. In a preferred embodiment, the measurement device comprises multiple scales, such any combination of radius, diameter, linear measurement scales, and other linear or nonlinear transform scales, and is marked in multiple systems of units such as according to British and International systems of units.

Returning to the exemplary CPO Ruler, it is now newly feasible to provide on a PCB not only an entire electronic circuit, but also pedagogical information about it such as its schematic diagram, parts identification data, performance data, multiple alternative informational labels for the circuit or its components, data for its use, opportunities for safe effective owner-builder modification and upgrade, and not inconsequentially, exposed direct viewing of the finished device or appliance that permits the builder's work to be a source of well-earned pride of accomplishment. In one embodiment, the visible surface of the CPO Ruler is marked with a table of data teaching the association of sounds in Morse code and their character or prosign equivalents.

In a preferred embodiment, the arrangement and configuration of the table of teaching data providing sound and symbol correspondence is designed, presented and printed to achieve optimal cognitive experience in learning. In one embodiment the tabular data are arranged according to the output of a computation that computes optimal learning sequencing based on maximizing the likelihood that a letter' sound pattern will sound similar to a previously learned symbol's sound, where table adjacency maximizes the cognitive cost of interference, forcing the learner to perform pure rote memorization of sound-symbol associations without performing any reasoning steps about lexical components of the sound such as remembering a symbol-sound association based on a conscious recollection of the number or pattern of dit and dah acoustic components of a character. In another embodiment, historic frequency-of-use data from one or multiple linguistic sources are employed to compute usage frequencies for individual symbols, and table position is adjusted or adapted to present the most frequent and thus most valuable symbols first for learning, to maximize the opportunity to learn symbols that can be composed together into words as early as possible in the Morse learning experience. In one embodiment, heuristic adaptations to algorithmic table positions are applied to accommodate the differential frequency of occurrence of symbols during Morse code communications as distinct from natural language communications. In a preferred embodiment, the presentation of table data is optimally determined by combining multiple such factors to achieve the most cognitively beneficial presentation for learning, pursuant to maximizing an objective function that represents achievement of the highest possible Morse code sending and receiving speed for real-world use in the shortest time with the highest confidence and lowest aggregate recognition failure rate. In a preferred embodiment. Morse symbol names are presented as their meaningful cognitive equivalents rather than in their most literal but less useful form, such as by presenting cognitively meaningful identifiers such as "laughter" or "Error" rather than "HIHI" or "EEEEEEEE".

CPO Ruler acoustic output can be achieved using an oscillator circuit such as a multivibrator circuit. In one embodiment, the multivibrator circuit output is buffered and provided to the user via an SMD audio jack. In a preferred embodiment, the resistance values between the buffer amplifier and the audio jack are selected and optimized to permit either monophonic or stereophonic load attachment and either earbud or headphones for individual listening or attachment of an active speaker for group or classroom use. In a preferred embodiment the CPO circuit comprises a SMD coin cell-type battery to provide electrical power without the necessity to attach an external battery to power the CPO.

In one embodiment, the circuit schematic of the CPO oscillator circuit is printed visibly on the Active Ruler to assist in pedagogy, construction, diagnosis, repair, and maintenance of the Active Ruler. In one embodiment, the formula for determining or estimating pitch frequency of the CPO oscillator is printed on the visible surface of the CPO Ruler, thereby providing the builder with directly accessible data required to adapt the CPO Ruler through use of alternative SMD components for pedagogical purposes or personal preference. In one embodiment, pedagogical information such as schematic depictions of certain important or hard-to-remember data, such as the distinction between a PNP and NPN bipolar transistor, are visibly present on the surface of the Active Ruler to assist in pedagogy, construction, maintenance, repair, and upgrade of the Active Ruler. In one embodiment, useful formulas are printed on the Active Ruler visible surface, beneficially supporting pedagogy and available for later use for reference purposes. Additional tabular or reference data are printed on either side of the Active Ruler to enhance its utility as a pedagogical and reference tool.

In one embodiment, the CPO Ruler circuit comprises a visual indicator such as an LED that flashes on and off in correspondence with Morse code. Use of non-acoustic indicia beneficially provides for silent use, multimodal feedback during Morse practice, and use by individuals with hearing disabilities. It will be appreciated that references to the "sound" of Morse code is exemplary, and that other indicia such as a flashing light or vibration either alone or in combination with an acoustic sound are intended and disclosed.

In one embodiment, a Morse code key capable of keying and activating the CPO oscillator circuit comprises a piece of fabricated metal, such as sheet brass cut to size and shape, that the builder may attach as a custom surface mount component. In a preferred embodiment, the key has a tail with a tab that descends at least partly downward into a hole in the PCB to hold the key in a proper three-dimensional position notwithstanding that the Active Ruler parts including the key are surface mount and thus mounted on a two-dimensional surface without through hole techniques. In one embodiment the key is three-dimensional in shape with at least two bends that permit the non-soldered action end of the key to hover over an electrical contact in optimal keying position, such as approximately 2 mm above the contact surface. In a preferred embodiment, the action end of the key hovers over a contact that comprises the surface mount coin cell, thus making direct contact with one conductive surface of the coin cell when the key is depressed, thereby "closing" or completing the CPO oscillator circuit and resulting in indicia such as light or sound being emitted in correspondence with Morse keying activity.

In a preferred embodiment a hole is drilled through the Active Ruler to permit it to hang vertically on a surface such as a wall or rack, thereby permitting it to be accessible and available for practical or reference use, to be displayed as an accomplishment of the builder, and to form an element among an array or collection of such devices built by the user. Preferably the hole is near one end and centered.

The CPO Ruler is an exemplary embodiment of an Active Ruler, and additional devices are intended and disclosed. For example, an Active Ruler may comprise a test equipment circuit, such as a circuit for digital voltmeter (DVM) measurement, a frequency counter, an oscillator generator circuit, a communications circuit such as comprises a Bluetooth or other wireless communications device that can be used to send and/or receive data and/or audio content and control remote devices in a portable format, an audiovisual musical device such as a metronome, pitch tuning aid, recording device, camera, or musical keyboard, or a control surface such as a data keyboard or other input-output devices. It also may comprise one or a plurality of displays, such as LCD or LED graphical or alphanumeric display components. These and many other embodiments beneficially incorporate a SMD MCU or MPU, which may be either builder-mounted or provided to the builder pre-mounted to the PCB, and which is preprogrammed with required custom functionality in firmware appropriate to the circuit such as frequency counting and voltage measurement such as using MCU ADC capabilities. In an alternative embodiment, the Active Ruler permits user configuration and control either by providing tools to permit the builder to program the MCU/MPU, or by virtue of a connection component that provides for attached or remote sources of firmware data to be loaded into or added to the MCU/MPU to provide or augment its desired functionality.

Security Methods and Systems for User-Built Educational Electronics:

We disclose the following security method and corresponding system. Hardware may be serialized with a preferably worldwide-unique indicator such as a unique serial number. One embodiment comprises a serial-numbered chip, such as the Microchip/Atmel AT24CSW series IC having internal hardware serial-number plus an OEM-writeable "tracking #". According to this method we compute a crypto-random OEM serial number (OEM-SN). We hash the chip serial number (CHIP-SN) with the OEM-SN, or vice versa. We write the hash to a memory component such as an EEPROM in write-once mode as a digital fingerprint. In an alternative embodiment, we hash one, the other or both with an OEM "password" corresponding to or assigned by the manufacturer to that OEM-SN (which password is not stored on-chip, for example it must be user-provided during product configuration or use or separately stored). When the hash is retrieved it can be compared with a live-generated hash to confirm all components match, indicating no fraud or piracy.

Without a password, the system is self-verifying. With a password, the system is self-verifying and further also thwarts a "replay attack" comprising duplication of the EEPROM contents, since the system now comprises two-factor authentication (2FA), that is, successful use also requires knowledge of the password. It will be appreciated that the hardware serial number beneficially may be a worldwide unique number the uniqueness of which is guaranteed by the hardware manufacturer, that the OEM-SN and OEM-password are worldwide unique guaranteed by the OEM, and the 3 serial numbers are embedded unchangeably in the chip solid-state electronics and/or in secured firmware.

Balanced-Fed Double-Balanced Modulator System and Method:

Conventionally modulation or demodulation such as in radio receiver electronics may be performed using a double-balanced mixer (DBM). Among other advantages, the DBM affords having all signals isolated from each other, minimization of spurious signal generation, and linearity of mixing response with respect to signal strength. A common DBM configuration comprises a bridge circuit of four nonlinear components such as a diode ring, or components having comparable function such as four Field Effect Transistors (FETs). In its common configuration, and using a received Radio Frequency signal as an example, the DBM is provided Local Oscillator (LO) and Radio Frequency (RF) input signals at a first and second pair of opposite sides of the bridge, known as its "ports." To accept or receive the unbalanced LO and RF signals, the DBM circuit further comprises a device for converting each of the single-ended or unbalanced LO and RF signals to a balanced signal and then feeding the resulting balanced signal to its respective two opposite bridge points or ports. For example, this may be achieved by using a balun device that accepts the unbalanced signal at the primary side of a transformer, with the balanced signal produced by means of a center-tapped secondary side of the transformer. The resulting mixed signal then may be extracted from the DBM as an Intermediate Frequency (IF) signal that equals the arithmetic product of the RF and LO signals. The IF commonly is produced from the DBM as an unbalanced signal between the RF signal secondary's center tap and external circuit ground.

Known limitations of the common DBM design are a theoretical loss of approximately 4 dB, usually in practical circuits up to twice that, and their use of an unbalanced feed and production of an unbalanced output. These limitations are material. The loss in the DBM results in a loss of received information, worse low-signal performance, reduced noise floor behavior, and a need for additional amplification stages and components that increase product cost and themselves inevitably introduce further noise, decreasing the signal-to-noise ratio and thus system performance. The requirement of an unbalanced input at all ports does not match either the presentation of a balanced input such as occurs with many higher-performance antenna and feedline systems or the potential availability of a balanced LO signal that could be produced by modern oscillators. For example, on the RF side, it is known that using unbalanced coaxial cable as a feedline results in significantly greater signal loss when its Standing Wave Ratio (SWR) is not perfect (1:1), nearly always the case, and higher performance is most easily achieved in the feedline through use of a low-loss open-wire or window line type balanced feedline. Also, notably, modern LOs are achieved using cost-effective ultra-low-noise ultra-low-jitter oscillator chips that comprise their own phase-locked loop (PLL) or other circuitry and replace individual-component traditional piezoelectric crystal oscillators. Exemplary recent modern LO chips include the Si545, Si547, and Si5341 oscillators from Silicon Labs.

Figure 6:
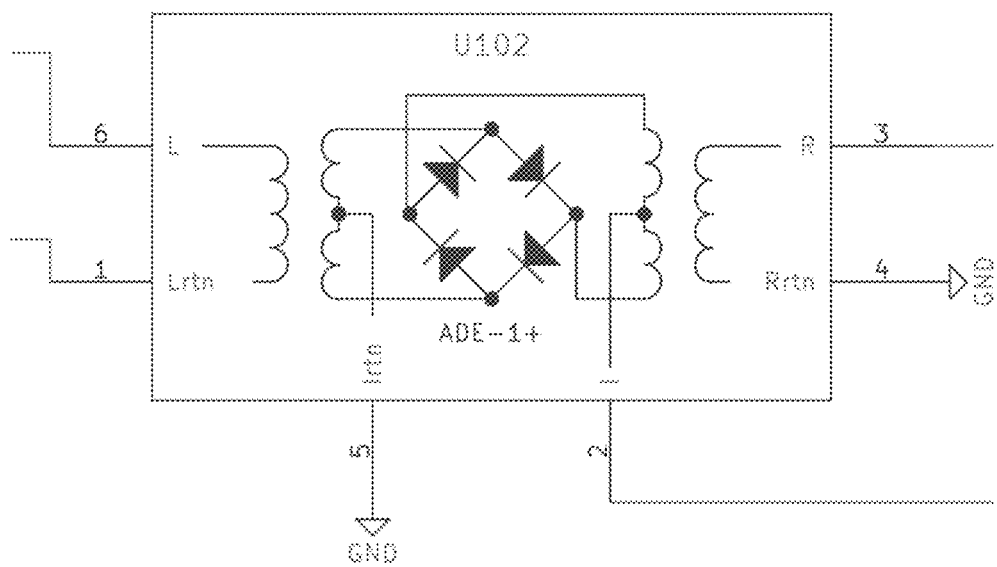
FIG. 6 depicts a Doubly Balanced Mixer (DBM) having a Local Oscillator (LO) input that is balanced, enhancing mixer performance, according to an embodiment.

In the present invention we eliminate the limitation of unbalanced circuits. In one embodiment, the LO signal is applied to the transformer's primary side LO contacts as a balanced signal, rather than an unbalanced signal, as shown in FIG. 6.

Figure 7:
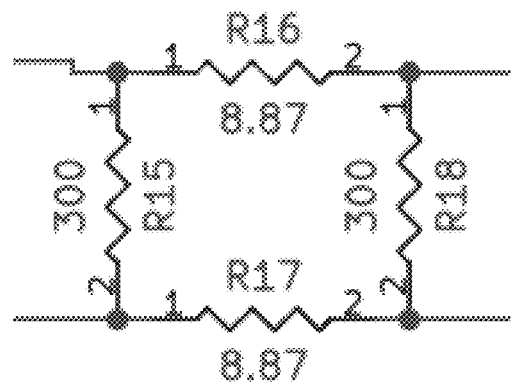
FIG. 7 depicts an impedance matching circuit according to an embodiment.

In a preferred embodiment, shown in FIG. 7, the balanced LO signal source is impedance-matched to the DBM's LO input using an impedance matching circuit. In one embodiment, the impedance matching circuit is a balanced pi circuit, such as one comprising resistors. Use of four resistors in a pi circuit beneficially offers a frequency-independent impedance match by virtue of the negligible reactance of the resistors. In a preferred embodiment, anywhere in the circuit, and including in the impedance matching pi circuit, the selection of resistors may be further optimized to minimize thermal noise introduced by the resistors to maintain the best possible circuit noise figure.

Figure 8:
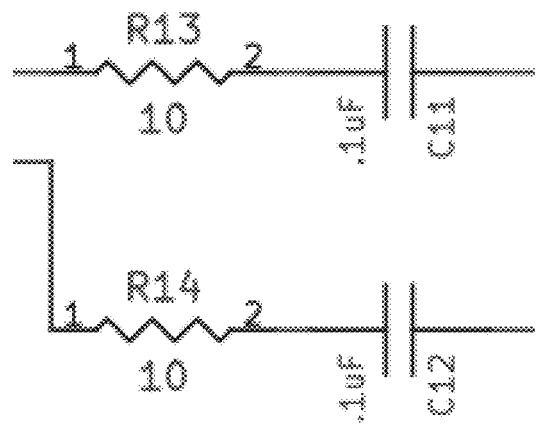
FIG. 8 depicts an impedance matching circuit according to an embodiment.

In a preferred embodiment, the impedance matching is beneficially decoupled from the oscillator using an AC-coupling capacitor and impedance-matched as required using a resistor, on each side of the balanced output of the oscillator, as shown in FIG. 8.

Figure 9:
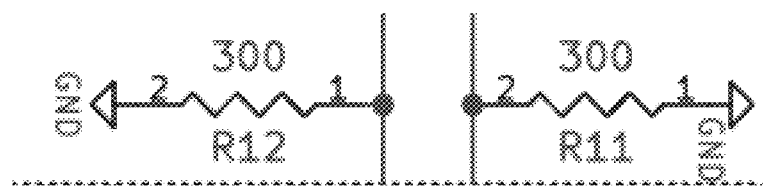
FIG. 9 depicts a thermal noise reduction circuit according to an embodiment.

The output voltage of each side of the oscillator's balanced output may have its voltage determined using a pullup, pulldown, or voltage divider resistor circuit. In a preferred embodiment, only one resistor is used per side to minimize thermal noise, as shown in FIG. 9.

In a preferred embodiment, the LO frequency may be selectable. For fixed frequencies, frequency selection of one of a plurality of available fixed frequencies occurs through output enable/disable voltages. These voltages may be applied either electromechanically, such as through an operator-selected switch, or digitally under the control of an MCU or MPU. For variable frequencies, a microcontroller provides data to the oscillator chip using a protocol for data and control such as SPI, I2C, or other data protocols to reconfigure the oscillator chip to provide the desired frequency.

Figure 10:
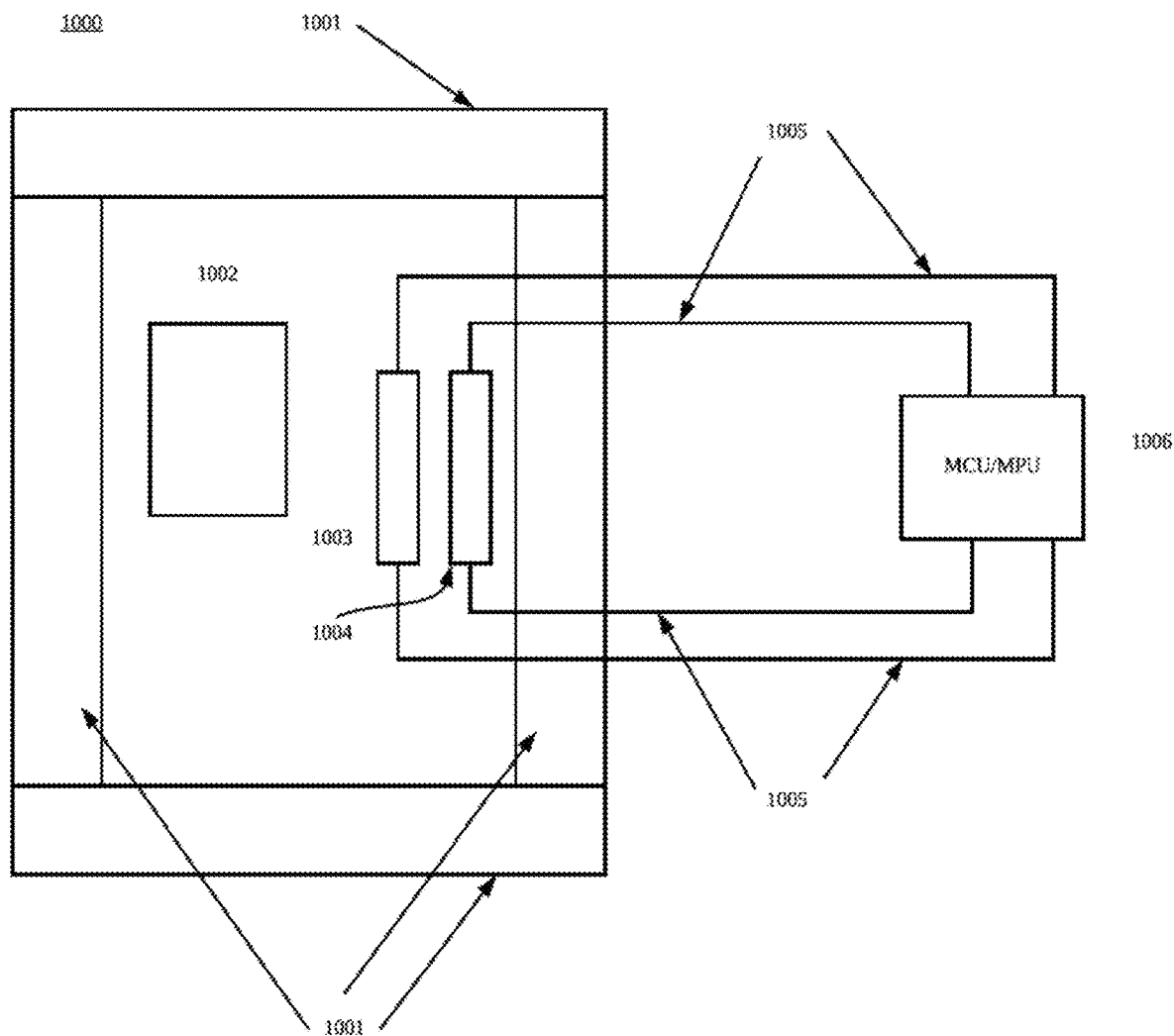
FIG. 10 depicts a temperature control oven according to an embodiment.

In a preferred embodiment, the oscillator and microcontroller are collocated on a single printed circuit board. Collocation on a common PCB beneficially permits optimal temperature measurement and control, maximizing frequency stability, frequency reliability, and ability to construct and rely on computational performance models of the circuit to further optimize circuit behavior and performance. Effective frequency control further may require temperature control of critical components in the oscillator circuit. We disclose a method and system for such temperature control that is compatible with personal construction of electronics, including using either through hole or SMD techniques or a combination thereof. In one aspect, a small "oven" is constructed comprising at least one frequency-determining device, at least one temperature measurement device, and at least one heating device. In a preferred embodiment, the temperature-sensing device is a diode junction, such as occurs in a semiconductor diode or other solid-state component, and the heating device is a resistor. The oven is enclosed in an enclosure having poor heat transmissivity. FIG. 10 depicts an exemplary embodiment of an oven 1000, in which insulating enclosure walls 1001 contain an electronic oscillator component 1002 whose temperature is controlled. Resistive heating component 1003 and temperature-sensitive diode-junction sensing component 1004 are housed within the oven 1000. Printed circuit board (PCB)

traces 1005 connect the components 1003 and 1004 to a microcontroller/microprocessor (MCU/MPU) unit 1006.

In an exemplary embodiment, the oven enclosure walls 1001 comprises pieces of foam, such as a few millimeters thick, and a small "igloo" of this foam (or other non-heat-transmissive material) is constructed surrounding the oven components on five sides, with the PCB below as the sixth side of the igloo box. PCB traces from the heating resistor and sensing diode run to a MCU that is purpose-programmed to sense current passing through the diode, convert the current to a temperature, and respond by sending current to the heating resistor to heat the inside of the oven until a desired temperature profile is achieved. The MCU firmware program for oven temperature management may employ an algorithmic or heuristic model of the relationship between diode current, resistor current, and temperature. In a preferred embodiment, this mathematical relation is predetermined and encoded as a lookup table, which beneficially employs a space-time tradeoff in the firmware to reduce MCU work, permitting a less expensive simple MCU to be used or freeing the MCU to perform additional tasks. Preferably, the method comprises experiments employed to determine the best starting values for the lookup table or algorithmic representation of the mathematical relation between temperature, time, diode current, and resistor current, and these experimental data are used to initialize or "seed" the system. Thereafter, because different builders will produce slightly different ovens, such as being characterized by slightly different heat leakage, the temperature of an individual builder's oven may not precisely match the expectation of the a priori model. In one embodiment, the temperature is sensed and compared to the stored initial model for the relation, and the relation is adapted for the specific oven. For example, values in the lookup table may be adjusted slightly to better adapt it to the individual oven it controls. In one embodiment, a standard thermal set point is encoded into the MCU firmware. In an alternative embodiment, the thermal set point is configurable, providing for adaptation to different operating environments, oven leakage rates as-built, small oven component differences, and other small variations to optimize the oven's ability to maintain a stable operating temperature and thereby maintain the maximally constant frequency of the oscillator.

Returning to the LO comprising an MCU and a variable oscillator, the two components are preferably mounted on the same PCB. Preferably, any frequency-determining components subject to ambient effects are in an oven such as that described above. In a preferred embodiment, the PCB is a small "daughterboard" module comprising the MCU chip, synthesizer/oscillator chip, frequency-determining components preferably in an oven, control and data lines between the two chips, and control and data lines to an external connector such as a header. This beneficially provides for the daughterboard to be mounted by a builder to the builder's electronics system in progress, and for the daughterboard components to be reliably pre-manufactured and assembled and comprise a single component from the perspective of the builder. In a preferred embodiment, the MCU firmware is programmed to manage the detailed interaction with the synthesizer/oscillator IC, and presents a more abstract interface to its connector or header pins, such as accepting a suitably encoded and compact form of predicates such as "What is the frequency of oscillator 3?", "Set oscillator 2 to 14.010000 MHZ," "Report all oscillator state variables," "Report failures of the synthesizer chip." "Reset to a defined starting state," and "Disable/enable all oscillators." Thus for example a separate second MCU or MPU elsewhere in the larger system under construction can issue commands and requests to the daughterboard MCU to control oscillator frequencies or query states in accordance with the objectives of the overall system or its user. It will be appreciated that included among the above named synthesizer chips are synthesizer ICs that can produce more than one simultaneous frequency output over an extremely wide frequency range, and thus the daughterboard MCU firmware thus orchestrates all these individual oscillators in the synthesizer chip simultaneously through control signals and data passed between the MCU and synthesizer chips. In one embodiment, control and data lines on the PCB are brought out to the headers to permit raw data inspection or management, such as for use during construction, debugging or diagnosis. In another embodiment, firmware in addition to its frequency management functions, the daughterboard MCU comprises self-test and user assistance, as disclosed further below.

Methods and Systems for Self-Test of Educational Electronics:

We now disclose methods and systems for enhancing individual construction of electronics, including through additional electronics and/or firmware providing for step-by-step test and confirmation of successful assembly steps, with the additional electronics and/or firmware performing measurement, assessment, diagnosis, confirmation, recommendation, explanation, documentation, and guidance data to the builder.

In the context of the present application, a system that an individual electronics builder can construct (a constructible system) will tend to involve some or all of the following. First, such a system generally will not require robot pick-and-place and soldering apparatus to install electronic components. Rather, the system will comprise parts that are possible to see, that have readable markings, and for which human fingers are sufficient to handle, position, hold in place, and attach with manual tools. Attachment should be possible using reasonably non-toxic materials (such as solvents, glues, solder) and in conventional home or office ambient physical environments (no clean room or deadly gases, no extremely high or low temperatures required). Parts should be identifiable and distinguishable with the naked eye or with commercially available low-power magnifying tools. Assembly should be reliable, that is, parts must be designed with connecting components and tolerances that cause them to fit together properly so as to meet the physical and operational specification of the product each and every time they are assembled, including by non-expert and first-time builders of all ages, including youths who may lack prior assembly experience and elderly who may have vision or dexterity challenges.

The just-listed criteria differentiate the buildable systems described herein from modern electronics such as cellphones and other complex systems. Such systems can require machine installation of electronic components (e.g. robot pick-and-place from component reels, oven soldering or wave soldering), using microscopic parts too fine for handling, positioning, and installation by human hands. In accordance with aspects of the invention, novel methods and systems allow home builders and unskilled people to construct modern electronics reliably by hand in an age where such construction or assembly effectively is otherwise impossible.

In one embodiment, after the builder performs the first steps of electronics assembly, the builder connects the work-in-progress to external computing and communications infrastructure which aids the builder in testing, diagnosing, and/or completing the build. In one embodiment, the electronics kit comprises a system and method to sense the condition of the electronics and communicate with intrinsic and/or extrinsic systems comprising methods for assessing its condition, diagnosing build or performance problems, advising the builder as to solutions to problems diagnosed by either the system or user, measuring and confirming the resolution of those problems, proposing improvement in the system, and local or remote display or other reporting of status and actions including sensor data and diagnosis/improvement information.

In a preferred embodiment, this system comprises a microcontroller or microprocessor unit (MCU/MPU) augmented with custom firmware or other software that is embedded in or connected to the electronics kit, and the method comprises execution of the firmware or software on the MPU/MCU to sense the state of the electronics.

The firmware on the MPU/MCU collectively comprises a firmware image, which may comprise any required combination of data and executable processor instructions.

In a preferred embodiment, the assistive method is implemented at least in part in a firmware image that is loaded onto the MPU/MCU after which it is secured against unauthorized read access. This beneficially prevents theft of the intellectual property comprised in the firmware. Many MPU/MCU chips are manufactured to provide a "security bit" or "fuse" or other means of preventing their firmware from being read, copied and stolen, and they comprise one embodiment for implementing this securing method and system. In an alternative embodiment, the data and/or instructions of the firmware image may be encrypted in whole or in part, stored in memory device that may be either embedded, remote or attached directly or indirectly such as through a network to the MPU/MCU, and the MPU/MCU comprises encryption/decryption functions to permit the otherwise unreadable firmware to be used while it resides on the MPU/MCU.

In one embodiment, the MPU/MCU is dedicated hardware that solely provides these methods. In an alternative embodiment, the methods are additional to firmware in an MPU/MCU that already is part of the circuit design, where these methods are added to or incorporated into its firmware or other software to allow it to serve the dual purpose of supporting build-time diagnosis functions and later supporting or providing for the normal operation of the resulting assembled electronic device or system. For example, in this invention's LO daughterboard embodiments, the MCU on the daughterboard may further comprise assistive or self-test firmware that guides the builder to success.

In one embodiment, the software or firmware may be updated after it first has been provided to the MCU/MPU. In one embodiment the system comprises electronics to permit replacement of the whole firmware image. For example, this may be provided by an interface to the MPU/MCU such as via I2C. SPI and/or USB and a presented controllable voltage at the MPU/MCU that instructs the MPU/MCU to accept and load a new firmware image that replaces the prior firmware image on the MCU/MPU. In an alternative embodiment, individual components of the firmware or software may be dynamically loaded into the MCU/MCU to update it by either augmenting, deleting or replacing certain prior executable instructions and data without replacing the entire contents of the MCU/MPU firmware or software. Such firmware/software may provide new functionality, correct errors in prior functionality, alter the security conditions of the electronics, permit personalization or adaptation of the firmware or software, and/or permit augmentation of the electronics with new devices or apparatus such as attached or substituted accessory electronics that modify or improve its user-accessible functions. In a preferred embodiment, this software/firmware update is performed by communicating into the MPU/MCU data comprising object-oriented computational procedures and data that are embedded into the existing software object namespace of the MPU/MCU firmware and/or that provide an additional new software object namespace. Such objects may be communicated to the MPU/MCU as one or more data blocks, serial data streams, parallel data streams, or network packets.

Enclosure and Mounting Systems and Methods for Educational Electronics:

Educational electronics systems can benefit from newly designed systems and methods for construction including as to physical enclosures. In one embodiment, an educational electronics system comprises a system of subpanels having user-modifiable knockouts and penetrations. In one embodiment, the knockout comprises an incompletely cut rectangular window region in a plastic subpanel. If the knockouts are not to be used, they are covered over by the builder during assembly with a graphic overlay. The graphic overlay may be comprised of a thin layer of polycarbonate impregnated with ink according to a pattern that provide markings, logos, cosmetics such as color schemes, colored regions with frequency-dependent light admission to achieve a display window effect, and backed by a strong adhesive. Alternatively, if the knockouts are to be used, the builder can remove the knockout by cutting through the small incomplete-cut region of the knockout rectangle, thereby opening the rectangle for use, and applying a different graphic overlay with a cutout or window corresponding to the knockout region. This method and system provide for economically efficient inventory and use of a single manufactured component in educational systems where the builder's discretion at assembly time determines the final device configuration, and thereby its operational features. In an exemplary embodiment, a rectangular region may be knocked out during assembly if the builder wishes to install an optional component such as an additional electronic jack that provides for audiovisual or communications data transfer between the device being assembled and other attached or networked devices.

This method and system provide for user-mountable parts to be incorporated both at initial assembly time and also as later feature upgrades the builders may themselves perform.

In another embodiment, a plurality of subpanels in precise alignment are used to provide a stable multilayer mounting system for builder assembled components. In one embodiment, two thick acrylic subpanels with penetration regions are precision-cut with a laser cutter to extremely fine manufacturing tolerances and placed in registered apposition by the builder during assembly using anchor and screw devices that enforce precise alignment through right angle junctions and long lever arms where mounting components meet, thereby providing for very precise alignment of components attached to, adjacent to, impinging on, or passing through the subpanels, such as switches the builder inserts through the multiple subpanel layers. Different subpanel layers may comprise correspondingly different cutout and penetration regions to accommodate such components and cause them to be precisely mounted and aligned by the builder of the educational electronics device.

Methods and Systems for Integrated Multimodal Educational Instruction for Electronics Assembly, Diagnosis, Study, and Use:

A challenge in building and using modern electronics is understanding what the electronics is doing inside, especially at multiple levels of intellectual abstraction and for both intended and pathological operating states. For example, an electronic system may be understood at the level of semiconductor physics, or of presented voltages and current flows among circuit components, or of cooperating subsystems in a block diagram, or of physical components in a spatial three-dimensional (3D) arrangement with respect to each other. When the user-owner is also the builder of the electronics, in addition to understanding the electronic device as an appliance to be used the builder also typically will enjoy greater than usual familiarity with the device's construction, including physical arrangement of its components. The builder further typically will have a high interest in becoming educated about and understanding the device's structure and function at the other levels of abstraction. For example, builders may want to understand the device's circuit-level description, something of the underlying physics, and how these relate to the components that builders themselves physically arranged in the course of construction. This multiple-abstraction understanding also is important or essential in troubleshooting, diagnosis and debugging, repair, maintenance, subsequent upgrade, and experimentation.

Circuit simulator software is known and in common use today suitable for some electronics circuit design tasks, and in some cases it may contain limited information about solid-state physics. But it is not complete, in the same way that a hammer is neither a complete description of a house, nor usable to construct one without a blueprint, and a hammer is incapable of teaching its user how to use itself. In electronics, circuit simulators typically require considerable electronics engineering knowledge, expertise and effort to apply them to a design or understanding task. They comprise no pre-existing data as to a specific circuit or appliance, and lack a pedagogy. As a result they are effectively never used as a pedagogical tool to aid an individual non-engineer consumer in building or understanding an appliance-quality electronics kit.

We disclose a method and system wherein a computable model, such as may exist as a collection of relations stored in a computer augmented with corresponding reasoning techniques, comprises one or more related abstract models of the electronic equipment. These models are designed to interoperate compatibly, representing the same electronic appliance or system in different ways and from different perspectives. The models are augmented with a pedagogical method that represents the physical appliance or device, the desired user knowledge about it, the actual knowledge demonstrated or believed to be held by the user, the workflow of educating a user to learn by improving their knowledge, and the important cognitive relationships to be taught that relate different abstract and concrete representations of the structure and function of the appliance. In one embodiment, the circuit level of abstraction comprises data in a form that is sufficiently compatible with a circuit simulator to permit the circuit simulation program to be used to depict and analyze electrical-level behavior of the device. In a preferred embodiment, a reward model beneficially induces the user to succeed in tasks such as assembly, functional understanding, diagnosis, repair, upgrade, maintenance, and configuration by tracking the user's learning progress with respect to tasks performed and a desired pedagogical workflow and provides feedback on learning performance. In one embodiment, this learning system further comprises a recording or communications component that permits learning progress, success, problems, new content, and feedback to be archived and remotely communicated. In one embodiment, the learning system for the appliance communicates to a local system such as a personal computer or to a remote computer system such as a World Wide Web server or other computer configured to provide services via a telecommunications network such as the Internet and/or telephone system network. Activity of the system is observable at different abstraction resolutions, such as physical or exploded-parts diagrams in correspondence with circuit diagrams and circuit simulations. In one embodiment, the multiple layered model resides in the device, such as in an MPU, permitting the device to assist the user in configuring, using, diagnosing, explaining, and repairing itself. In an alternative embodiment, the model data reside remotely, such as on a remote Web server, which may be in communication with the device under study to pass control and data information between the two to support the builder-user activity. Diagnosis models may comprise computable information characterizing components and relating their structure and function in both normal and pathological operating states, in order to assist the user in diagnosis and learning tasks.

SMD Soldering Learning System and Method:

In one embodiment, a system for teaching SMD soldering comprises a first test or practice soldering device. The practice soldering device comprises a PCB with SMD solder point pads exposed through solder mask. In a preferred embodiment, the method and system comprise first teaching the student to solder "unused" parts onto the PCB, that is, true SMD parts are attached by soldering but they have no electronic function in the circuit and are present to provide a first opportunity to solder SMD components with no risk to any circuit. In a preferred embodiment, after initial "unused" no-circuit parts are attached by the student, the student solders large-size SMD parts onto the practice PCB. The student then is instructed to solder smaller SMD parts onto PCB. This method and system beneficially build experience, competence, and confidence in the student by providing a progressively more difficult sequence of challenges according to a supportive educational pedagogy using purpose-designed learning devices and method instructions.

In a preferred embodiment, the practice circuit comprises a useful device once completed. An example of a useful device is a piece of test equipment such as a battery voltage meter. In one embodiment, the practice circuit comprises a battery voltage meter with a current-limiting resistor. Zener diode, and one or a plurality of LEDs. In a preferred embodiment, the Zener diode is selected to cause the LED to light when a battery or battery cell attached or held against electrically conductive contact pads on the practice PCB has a voltage designated as "charged." and does not light an LED when the battery voltage is below the level designated as charged. For example, for a nominal 9V alkaline battery the typical useful range of operating voltages is approximately 6.5V to 9V. A 5.1V Zener diode in series with a current-limiting resistor of 100 ohms and a red LED having a nominal 2V forward voltage drop will cause the LED to light only if the battery charge exceeds approximately 6.5V. The current-limiting resistor and LED in series comprise a first display circuit for displaying the battery voltage. In an alternative embodiment, a second display circuit connected in parallel to the first provides indication of a different level of battery voltage to more precisely display the battery voltage. For example, the second display circuit may comprise two red LEDs in series with a second 100 ohm current-limiting resistor, which will light only when the battery attached to the circuit or touching the pads has a charge level of at least 8.0V. The builder first attaches, such as through surface mount soldering, the first display circuit and Zener diode, and immediately can confirm success by touching a 9V cell to the battery pads of the circuit. The builder then may install the second display circuit components and determine with greater accuracy the battery voltage, by again touching its contacts to the battery voltage measurement pads and observing whether only the first display circuit or also the second display circuit lights. It will be understood that once the Zener diode voltage has been exceeded, the first display circuit LED will emit light in a monotonic and typically substantially linear relationship to the current flowing through its resistor. Similarly, once the second voltage threshold has been exceeded, the second display circuit's LEDs will emit light corresponding to the current flowing through their resistor. This method and system beneficially permit an inexperienced builder to incrementally build and test a primitive bargraph voltage indicator circuit, such as one comprising surface mount electronic components, and to receive immediate positive feedback confirming their mastery of the technical skill of soldering the SMD parts.

VU Meter Systems and Methods:

In use of an analog VU meter, if any analog input signal during audio recording exceeds 0 dB Full Scale (0 dBfs), then the signal may clip and distort. In the digital recording domain, reaching or exceeding the 0 dB Full Scale value typically makes the recording valueless, unlike the analog world where it may merely cause distortion. Thus during modern recording, such as making a CD or other digital copy of an already-owned vinyl recording, it is essential to know whether the 0 dbFS value is ever exceeded and alert the user/recording engineer to review or discard the recording and start over.

We disclose a VU meter beneficially including an alarm function. In one embodiment the alarm function is available as a digital output signal from a VU meter. In one embodiment, the system alarms according to a policy implemented in an MCU at one or more of: on full scale, on specified threshold value, on exceeding a threshold value for more than a specified time, on dynamic range exceeding a minimum or maximum threshold value. The VU display in one embodiment comprises an arc-shaped set of adjacent rectangular LEDs configured to form a bargraph. In another embodiment the bargraph display is a true analog meter movement, such as via a D'Arsonval movement meter. In another embodiment the meter display is digitally simulated, for example by using a Heathkit Digilog™ display or a graphical output surface such as a TFT LCD display. In a preferred embodiment, multiple colors are used and configured to encode both a monotonic range of values and successive groupings of meaningful VU value subranges such as safe, borderline, and excessive input signal level. In an LED embodiment, multiple colors may be achieved by using different color LEDs. In an alternative embodiment, multiple colors may be achieve by using multicolor LEDs, such as "white" LEDs that may be electrically biased to produce one selected color from among several different possible colors. In a preferred embodiment, dynamic range is displayed by simultaneously lighting an adjacent subset of LEDs corresponding to the deciBel range of the lowest to highest observed values. Observation range for dynamic range, and also for peak values, is configurable. In one embodiment a time decay function is applied to minimum and maximum observed input signal values to define recency, and the recent observed dynamic range is displayed. In another embodiment the dynamic range minimum and maximum are remembered and displayed by the VU meter device until the user resets their value. Values that may be recorded and displayed further include greatest-peak-since-last-reset, time-decayed peak value, current dynamic range, and/or current signal level at any of several alternative time decay values. In a preferred embodiment more than one of these values are simultaneously presented. For example, the greatest-peak-since-last-reset value may stay lit at all times, which lower dB value indicators show dynamic range or current signal level over the past n milliseconds, where n is configurable.

A reset function may comprise either of a user input such as a button press or a control input such as a dry contact signal voltage change, digital data received by the device, a signal from an internal or external timer circuit including from a device attached via a network, or a condition from an MCU or MPU that establishes the reset condition. Maximum and minimum observed values are used to record and display dynamic range and peak values. In one embodiment, the lowest nonzero-valued minimum observed signal value is remembered and displayed as the minimum dynamic range value to eliminate the zero-value effect of a no-input-signal condition, thus providing for reporting dynamic range only for times when an input signal was present. In a preferred embodiment, the nonzero-valued minimum is computed based on a minimum time measurement threshold, in case the input signal does momentarily achieve true zero, to allow a wide dynamic range to be distinguished from a silent period of no input signal. In a preferred embodiment, the noise floor based on phenomena such as maximum or average input noise in a no-signal condition and Johnson thermal noise is taken into account and removed from the input signal computation to adapt the minimum value to the ambient or internal device noise floor characteristics, thereby beneficially providing a more reliable minimum or dynamic range indication in the presence of signal noise or thermal noise.

In one embodiment, a communications adapter module provides for exporting information content out of the VU meter. The communications adapter module also may provide for external devices to send configuration data and commands to the VU meter. The module translates the internal voltages of the VU meter's MCU or MPU, which may be available only as TTL-level voltages, to a networking protocols such as Bluetooth or Ethernet. Thus the internal MCU of the VU meter can provide its alarm values, and also other operating data, via the communications adapter module interface to a separate electronics such as a local attached computer or a local or remote hub. In one embodiment, the hub is a computer that receives one or a plurality of VU meter inputs, retains records as to alarm conditions or other data received from each VU meter, formats them into an accessible form for summary or individual collection of data, and makes them available locally or remotely. In one embodiment, the formatting comprises creating a static or dynamic content web page which can be visited over a network such as a LAN, an Intranet, or the Internet to permit one or a plurality of VU meters to be remotely monitored and managed.

The described embodiments of the invention are intended to be exemplary and numerous variations and modifications will be apparent to those skilled in the art. All such variations and modifications are intended to be within the scope of the present invention as defined in the appended claims. Although the present invention has been described and illustrated in detail, it is to be clearly understood that the same is by way of illustration and example only, and is not to be taken by way of limitation. It is appreciated that various features of the invention which are, for clarity, described in the context of separate embodiments may also be provided in combination in a single embodiment. Conversely, various features of the invention which are, for brevity, described in the context of a single embodiment may also be provided separately or in any suitable combination. Where exemplary communications embodiments are disclosed, it will be understood that communications are not limited to any particular physical medium or protocol and may occur by, for example, Internet, Intranet, cell phone, WiFi, Bluetooth, landline phone, fiber connection, satellite, Near Field Communication, radio telecommunication, as data or multimedia content, and/or using all other communications media and protocols, or any combination thereof.

Combination of all of the foregoing methods and apparatus also are intended and hereby disclosed.

What is claimed is:

1. A system for teaching electronics, comprising:
a printed circuit board configured to accept surface mount device electronics components, said printed circuit board having a silkscreen, said printed circuit board adapted to provide information content in said silkscreen comprising at least one of a schematic diagram, reference data, pictorial information, and ruler scale markings;
said printed circuit board comprising solder pad footprints adapted to accept more than one size of surface mount device electronic component compatibly.

2. A system for teaching electronics, comprising:
a printed circuit board configured to accept surface mount device (SMD) electronics components, the printed circuit board comprising solder pad footprints adapted to accept more than one size of (SMD) electronic component compatibly, said more than one size of SMD electronic component comprising a size of a larger SMD part and a size of a smaller SMD part, said adapted solder pad footprints having an exposed area not covered by a solder mask suitable for said larger SMD part, said exposed area being augmented at the point where two pads for an SMD electronic component have their closest approach until an interpad spacing is nominally equal to an interpad spacing used for said smaller SMD part, thereby allowing either said larger or said smaller SMD part to be soldered into place by a builder.

3. An Active Ruler™ system for teaching electronics, comprising a printed circuit board having an upper surface, said printed circuit board affording attachment of surface mount device (SMD) electronic components to said upper surface to allow the printed circuit board to lie flat on a second surface, said printed circuit board further adapted to provide information content comprising at least one of a schematic diagram, reference data, pictorial information, and ruler scale markings, said upper surface comprising a region where a builder can attach SMD electronic components, wherein said SMD electronic components function as an electronic circuit.

4. The Active Ruler system of claim 3, wherein said information content comprises one of information assisting the builder in constructing said Active Ruler and information assisting a user in using the Active Ruler.

5. The Active Ruler system of claim 3, wherein said information content is silkscreened onto the Active Ruler over a solder mask during a printed circuit board manufacturing process.

6. The Active Ruler system of claim 3, where the Active Ruler comprises ruler markings along its body to depict and provide for measurement of length.

7. The Active Ruler of claim 6, wherein said markings comprise at least one mathematical transform applied to a standard measurement scale to permit direct measurement of one of a scaled quantity or a nonlinear quantity without computation.

8. The Active Ruler of claim 7, where said mathematical transform scales a length of said markings by exactly pi.

9. The Active Ruler of claim 7, where said mathematical transform scales a length of said markings by exactly pi divided by 2.

10. The Active Ruler system of claim 3, where said Active Ruler performs the useful function of Code Practice Oscillator (CPO) electronics suitable for learning, teaching, and using Morse code.

11. The Active Ruler system of claim 10, wherein said information content comprises markings on a visible surface of the Active Ruler, said markings comprising a table of data teaching the association of sounds in Morse code and one or a plurality of their character or prosign equivalents.

12. The Active Ruler system of claim 10, wherein said information content comprises tabular data arranged according to the output of a computation that computes an optimal learning sequencing based on maximizing a likelihood that a letter's sound pattern will sound similar to a previously learned symbol's sound, wherein table adjacency of said tabular data maximizes a cognitive cost of interference, said optimal learning sequencing thereby forcing the learner to perform pure rote memorization of sound-symbol associations without performing any reasoning steps about lexical components of the sound.

13. A method of storing and using Computer-Aided Design (CAD) data for printed circuit boards, said CAD data comprising solder pad footprints, adapted to accept more than one size of surface mount device (SMD) electronic component compatibly, said more than one size of SMD electronic component comprising a size of a larger SMD part and a size of a smaller SMD part, said solder pad footprints being stored in a CAD footprint library on a computer, said solder pad footprints being augmented footprints comprising an exposed area not covered by solder mask suitable for said larger SMD part, said exposed area being augmented at the point where two pads for an SMD electronic component have their closest approach until an interpad spacing is nominally equal to interpad spacing used for said smaller SMD part, thereby allowing either said larger or said smaller size SMD part to be soldered into place by a builder.

14. The method of claim 13, where said augmented footprints are precomputed.

15. The method of claim 13, where said augmented footprints are applied at circuit design time.

16. The method of claim 13, where said augmented footprints are applied at PCB layout time.

17. A direct-measuring transformed measurement device, said transformed measurement device being a flexible measurement device marked with information providing one or a plurality of mathematically scaled or transformed markings, wherein said mathematically scaled or transformed markings represent at least one mathematical transform applied to a standard measurement scale, thereby permitting direct measurement of one of a scaled quantity or a nonlinear quantity without computation.

18. The measurement device of claim 17, further comprising information providing second markings, said second markings being conventional linear one-to-one scale markings.

19. The measurement device of claim 17, wherein the mathematically scaled or transformed markings comprise multiple scales from among one or a combination of radius, diameter, linear measurement scales, other linear transform scales, or nonlinear transform scales.

20. The measurement device of claim 17, wherein the mathematically scaled or transformed markings comprise comprises a plurality of systems of units, said plurality of markings being according to at least one of British and International systems of units.

\* \* \* \* \*